(12) United States Patent
Kidera et al.

(10) Patent No.: US 12,149,062 B2
(45) Date of Patent: Nov. 19, 2024

(54) ARC DETECTION DEVICE, INDOOR POWER LINE SYSTEM, SOLAR POWER GENERATION SYSTEM, AND STORAGE BATTERY SYSTEM

(71) Applicant: Panasonic Intellectual Property Management Co., Ltd., Osaka (JP)

(72) Inventors: Kazunori Kidera, Osaka (JP); Tatsuo Koga, Osaka (JP); Keita Kanamori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 110 days.

(21) Appl. No.: 17/907,847

(22) PCT Filed: Mar. 3, 2021

(86) PCT No.: PCT/JP2021/008295
§ 371 (c)(1),
(2) Date: Aug. 29, 2022

(87) PCT Pub. No.: WO2021/182261
PCT Pub. Date: Sep. 16, 2021

(65) Prior Publication Data
US 2023/0126245 A1 Apr. 27, 2023

(30) Foreign Application Priority Data
Mar. 11, 2020 (JP) .................. 2020-041738

(51) Int. Cl.
*H02H 1/00* (2006.01)
*G01R 15/20* (2006.01)
*G01R 31/40* (2020.01)

(52) U.S. Cl.
CPC ......... *H02H 1/0015* (2013.01); *G01R 15/202* (2013.01); *G01R 31/40* (2013.01)

(58) Field of Classification Search
CPC .... H02H 1/0015; G01R 15/202; G01R 19/10; G01R 31/083; G01R 31/1272; G01R 31/40
(Continued)

(56) References Cited

U.S. PATENT DOCUMENTS

| 4,356,443 A | 10/1982 | Emery |
| 2004/0066593 A1 | 4/2004 | Kolker et al. |

(Continued)

FOREIGN PATENT DOCUMENTS

| JP | 2011-7765 A | 1/2011 |
| JP | 2015-145847 A | 8/2015 |

(Continued)

OTHER PUBLICATIONS

Machine translation of Kanamaru et al. Japanese Patent Document JP 2015-211606 A Nov. 2015 (Year: 2015).*

(Continued)

*Primary Examiner* — Kevin J Comber
(74) *Attorney, Agent, or Firm* — Renner, Otto, Boisselle & Sklar, LLP

(57) ABSTRACT

An arc detection device is used in a system including one or more power sources, a plurality of converters, and a plurality of load devices. The one or more power sources and the plurality of converters are connected to each other by a plurality of power lines. The plurality of converters and the plurality of load devices are connected to each other by a plurality of power lines. The arc detection device includes: an electric current detector that includes a magnetic core through which two or more power lines included in the plurality of power lines extend, and detects combined currents flowing through the two or more power lines according to the magnetic field produced at the magnetic core; and an arc determiner that determines, on the basis of the combined (Continued)

currents detected by the electric current detector, whether an electric arc has occurred.

9 Claims, 3 Drawing Sheets

(58) Field of Classification Search
USPC .......................................................... 361/1
See application file for complete search history.

(56) References Cited

U.S. PATENT DOCUMENTS

| | | | | |
|---|---|---|---|---|
| 2014/0285010 A1* | 9/2014 | Cameron | ................... | H02J 7/35 |
| | | | | 307/29 |
| 2017/0117699 A1* | 4/2017 | Ostrovsky | ................ | H02H 3/16 |
| 2018/0210022 A1 | 7/2018 | Tomita et al. | | |
| 2019/0356127 A1 | 11/2019 | Ostrovsky et al. | | |

FOREIGN PATENT DOCUMENTS

| | | | |
|---|---|---|---|
| JP | 2015211606 A | * | 11/2015 |
| JP | 2018-28498 A | | 2/2018 |
| JP | 2018-119805 A | | 8/2018 |

OTHER PUBLICATIONS

International Search Report for corresponding Application No. PCT/JP2021/008295, mailed May 25, 2021.
Written Opinion for corresponding Application No. PCT/JP2021/008295, mailed May 25, 2021.
Extended European Search Report dated Jul. 27, 2023 in corresponding European Patent Application No. 21767146.0.
Chinese Office Action dated Sep. 20, 2024 in corresponding Chinese Patent Application No. 202180016318.7.

* cited by examiner

ARC DETECTION DEVICE, INDOOR POWER LINE SYSTEM, SOLAR POWER GENERATION SYSTEM, AND STORAGE BATTERY SYSTEM

TECHNICAL FIELD

The present invention relates to arc detection devices, indoor power line systems, solar power generation systems, and storage battery systems.

BACKGROUND ART

Conventionally, there is a known system that converts direct-current power supplied thereto from a photovoltaic (PV) panel (solar cell) or the like via a power line into alternating-current power using devices such as an inverter. A report indicates that such a power line is damaged or ruptured due to an external factor, degradation over time, or the like. There are cases where an electric arc (i.e., arc discharge) occurs due to damage or the like of such a power line. Thus, an arc detection means for detecting an electric arc has been proposed (for example, Patent Literature (PTL) 1).

CITATION LIST

Patent Literature

[PTL 1] Japanese Unexamined Patent Application No. 2011-007765

SUMMARY OF INVENTION

Technical Problem

In the future, it is expected that various devices are provided in a single system and a plurality of power lines are provided in order to supply electric power to the various devices. At this time, an electric arc may occur in each of the plurality of power lines. If the arc detection means is provided in each of the plurality of power lines, the electric arcs occurring in the plurality of power lines can be detected, but the size and cost of the system would increase.

Thus, the present invention provides an arc detection device, etc., capable of easily detecting electric arcs occurring in a plurality of power lines.

Solution to Problem

An arc detection device according to one aspect of the present invention is an arc detection device in a system including one or more power sources, a plurality of converters that adjust voltages of the one or more power sources, and a plurality of load devices. The one or more power sources and the plurality of converters are connected to each other by a plurality of power lines. The plurality of converters and the plurality of load devices are connected to each other by a plurality of power lines. The arc detection device includes: an electric current detector that includes a magnetic core through which two or more power lines included in the plurality of power lines extend, and detects combined currents flowing through the two or more power lines according to a magnetic field produced at the magnetic core; and an arc determiner that determines, based on the combined currents detected by the electric current detector, whether an electric arc has occurred. One or more converters included in the plurality of converters are connected to the one or more power sources. One or more converters included in the plurality of converters are connected to each of the plurality of load devices.

An indoor power line system according to one aspect of the present invention includes: the above-described arc detection device. One power source included in the one or more power sources includes a system power supply. The plurality of converters include AC/DC converters.

A solar power generation system according to one aspect of the present invention includes: the above-described arc detection device. At least one power source included in the one or more power sources includes a solar cell. Another power source included in the one or more power sources includes a system power supply. One load device included in the plurality of load devices includes a DC/AC converter connected to the system power supply.

A storage battery system according to one aspect of the present invention includes: the above-described arc detection device; a storage battery that operates as at least one power source included in the one or more power sources or at least one load device included in the plurality of load devices; and a system power supply that operates as at least one power source included in the one or more power sources or at least one load device included in the plurality of load device. During charging of the storage battery, the system power supply operates as a power source, a converter connected to the system power supply operates as an AC/DC converter, and the storage battery and a converter connected to the storage battery each operate as a load device. During discharging of the storage battery, the storage battery operates as a power source, a converter connected to the storage battery operates as a DC/DC converter, and the system power supply and a converter connected to the system power supply each operate as a load device.

Advantageous Effects of Invention

According to one aspect of the present invention, electric arcs occurring in the plurality of power lines can be easily detected.

DESCRIPTION OF EMBODIMENTS

Hereinafter, embodiments of the present invention will be described with reference to the Drawings. Note that each embodiment described below shows a specific example of the present invention. The numerical values, shapes, materials, structural elements, the arrangement and connection of the structural elements, etc. shown in the following embodiments are mere examples, and therefore are not intended to limit the present invention.

Note that the figures are schematic diagrams and are not necessarily precise illustrations. In the figures, substantially identical elements are assigned the same reference signs, and overlapping description is omitted or simplified.

Embodiment 1

Figure 1:
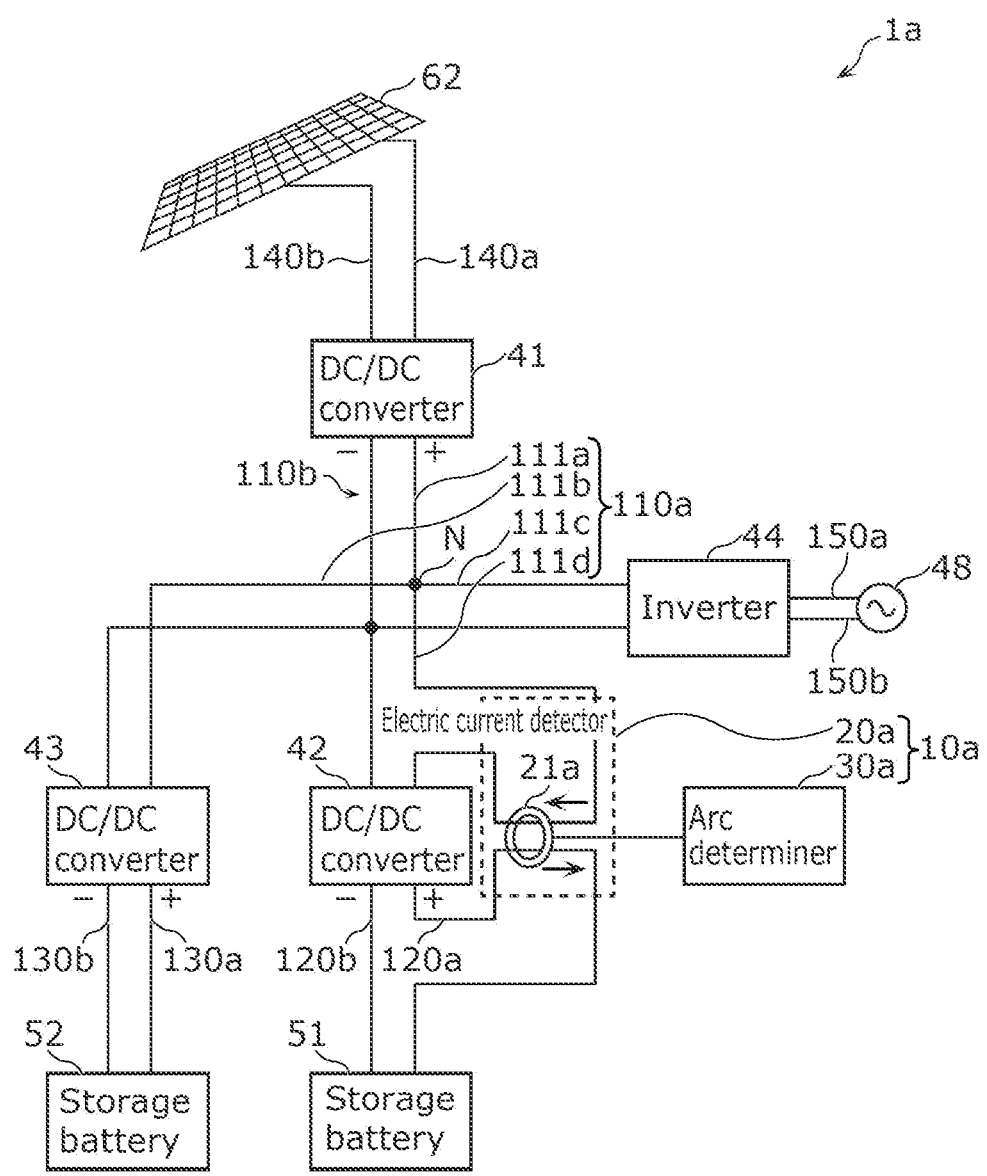
FIG. 1 is a configuration diagram illustrating one example of a system according to Embodiment 1.

FIG. 1 is a configuration diagram illustrating one example of system 1a according to Embodiment 1. System 1a is a solar power generation system as well as being a storage battery system (for example, a system including a photovoltaic function and a power storage function).

System 1a includes one or more power sources, a plurality of converters that adjust the voltages of the one or more power sources, and a plurality of load devices. Furthermore, system 1a includes arc detection device 10a. In Embodiment 1, solar cell 62, system power supply 48, and storage batteries 51, 52 are illustrated as the one or more power sources. Furthermore, DC/DC converters 41, 42, and 43 and inverter 44 are illustrated as the plurality of converters. System power supply 48, inverter 44, and storage batteries 51, 52 can be the load devices depending on situation.

One or more converters included in the plurality of converters are connected to the one or more power sources, and one or more converters included in the plurality of converters are connected to each of the plurality of load devices. In Embodiment 1, DC/DC converter 41 is connected to solar cell 62, which operates as a power source, inverter 44 is connected to system power supply 48, which operates as a power source or a load device, DC/DC converter 42 is connected to storage battery 51, which operates as a power source or a load device, and DC/DC converter 43 is connected to storage battery 52, which operates as a power source or a load device.

The one or more power sources and the plurality of converters are connected by a plurality of power lines, and the plurality of converters and the plurality of load devices are connected by a plurality of power lines. In Embodiment 1, solar cell 62 and DC/DC converter 41 are connected by the plurality of power lines, system power supply 48 and inverter 44 are connected by the plurality of power lines, storage battery 51 and DC/DC converter 42 are connected by the plurality of power lines, storage battery 52 and DC/DC converter 43 are connected by the plurality of power lines, and DC/DC converter 41, DC/DC converter 42, DC/DC converter 43, and inverter 44 are connected by the plurality of power lines. Specifically, solar cell 62 and DC/DC converter 41 are connected by power lines 140a, 140b, system power supply 48 and inverter 44 are connected by power lines 150a, 150b, storage battery 51 and DC/DC converter 42 are connected by power lines 120a, 120b, storage battery 52 and DC/DC converter 43 are connected by power lines 130a, 130b, and DC/DC converter 41, DC/DC converter 42, DC/DC converter 43, and inverter 44 are connected by power lines 110a, 110b.

Solar cell 62 is a power source that generates direct-current power by generating electric power using sunlight. The direct-current power generated by solar cell 62 is supplied to DC/DC converter 41 and then supplied to one load device (a load device including inverter 44 (specifically a DC/AC converter) connected to system power supply 48) included in the plurality of load devices. Solar cell 62 includes a positive electrode and a negative electrode; power line 140a is connected to the positive electrode, and power line 140b is connected to the negative electrode.

System power supply 48 supplies alternating-current power generated at a power station or the like. Note that as mentioned above, system power supply 48 can be a load device to which electric power is supplied, depending on situation.

Storage batteries 51, 52 each operate as at least one power source included in the one or more power sources and at least one load device included in the plurality of load devices. For example, during charging of storage batteries 51, 52, system power supply 48 operates as a power source, the converter (specifically, inverter 44) connected to system power supply 48 operates as an AC/DC converter, and storage batteries 51, 52 and the converters (specifically, DC/DC converters 42, 43) connected to storage batteries 51, 52 each operate as a load device. During discharging of storage batteries 51, 52, storage batteries 51, 52 each operate as a power source, the converters connected to storage batteries 51, 52 operate as DC/DC converters 42, 43, and system power supply 48 and the converter (specifically inverter 44) connected to system power supply 48 each operate as a load device.

DC/DC converter 41 increases or decrease the voltage of the direct-current power supplied thereto from solar cell 62 and outputs the direct-current power to DC/DC converters 42, 43 and inverter 44. DC/DC converter 41 includes a positive electrode and a negative electrode; power line 110a is connected to the positive electrode, and power line 110b is connected to the negative electrode.

DC/DC converter 42 increases or decreases the voltage of the direct-current power supplied thereto from DC/DC converter 41 or inverter 44 and outputs the direct-current power to storage battery 51. Furthermore, DC/DC converter 42 increases or decreases the voltage of the direct-current power supplied thereto from storage battery 51 and outputs the direct-current power to DC/DC converter 43 or inverter 44. DC/DC converter 42 includes a positive electrode and a negative electrode; power line 120a is connected to the positive electrode, and power line 120b is connected to the negative electrode.

DC/DC converter 43 increases or decreases the voltage of the direct-current power supplied thereto from DC/DC converter 41 or inverter 44 and outputs the direct-current power to storage battery 52. Furthermore, DC/DC converter 43 increases or decreases the voltage of the direct-current power supplied thereto from storage battery 52 and outputs the direct-current power to DC/DC converter 42 or inverter 44. DC/DC converter 43 includes a positive electrode and a negative electrode; power line 130a is connected to the positive electrode, and power line 130b is connected to the negative electrode.

A direct-current flows through each of power lines 110a, 110b, 120a, 120b, 130a, 130b, 140a, 140b. Power lines 110a, 120a are one example of two or more power lines extending through magnetic core 21a to be described later.

Inverter 44 operates as a DC/AC converter that converts the direct-current power supplied thereto from DC/DC converters 41, 42, 43 into alternating-current power and outputs the alternating-current power. Furthermore, inverter 44 operates as an AC/DC converter that converts the alternating-current power supplied thereto from system power supply 48 into direct-current power and supplies the direct-current power to DC/DC converters 42, 43. For example, inverter 44 converts the direct-current power into alternating-current power having a frequency of 50 Hz or 60 Hz. The alternating-current power is used in home appliances and the like. Alternating currents flow through power lines 150a, 150b connecting inverter 44 and system power supply 48.

The two or more power lines extending through magnetic core 21a to be described later are, for example, the power line connected to one input/output terminal of the first converter included in the plurality of converters and the power line connected to the other input/output terminal of the first converter included in the plurality of converters. For example, the first converter is DC/DC converter 42, and the two or more power lines extending through magnetic core 21a to be described later are power line 110a connected to one input/output terminal of DC/DC converter 42 and power line 120*a* connected to the other input/output terminal of DC/DC converter 42.

Power line 110*a* connected to one input/output terminal of DC/DC converter 42 is a branch power line that is divided as a plurality of branch paths 111*a*, 111*b*, 111*c*, 111*d*. The connection point between the plurality of branch paths 111*a*, 111*b*, 111*c*, 111*d* in power line 110*a* is denoted as branch point N. Specifically, the path connecting branch point N and DC/DC converter 41 is branch path 111*a*, the path connecting branch point N and DC/DC converter 43 is branch path 111*b*, the path connecting branch point N and inverter 44 is branch path 111*c*, and the path connecting branch point N and DC/DC converter 42 is branch path 111*d*. Branch path 111*d* extends through magnetic core 21*a* to be described later.

For example, focusing on DC/DC converter 42, electric currents flowing through power line 110*a* connected to one input/output terminal of DC/DC converter 42 and power line 120*a* connected to the other input/output terminal of DC/DC converter 42 are direct currents and therefore, there is a possibility that an electric arc may occur in each of power lines 110*a*, 120*a*. If the arc detection means is provided in power line 110*a*, an electric arc that has occurred in power line 110*a* can be detected, but high-frequency components resulting from an electric arc that has occurred in power line 120*a* are blocked by a capacitor and the like that are present in DC/DC converter 42; thus, it is difficult to detect the electric arc that has occurred in power line 120*a*. In contrast, if the arc detection means is provided in power line 120*a*, an electric arc that has occurred in power line 120*a* can be detected, but it is likewise difficult to detect an electric arc that has occurred in power line 110*a*. If the arc detection means is provided in both power lines 110*a*, 120*a*, an electric arc that has occurred in power line 110*a* and an electric arc that has occurred in power line 120*a* can be detected, but the size and cost of the system would increase.

Thus, arc detection device 10*a* is used in order to easily detect electric arcs occurring in two or more power lines (in this example, for example, power lines 110*a*, 120*a*) included in the plurality of power lines in system 1*a*.

Arc detection device 10*a* includes electric current detector 20*a* and arc determiner 30*a*.

Electric current detector 20*a* includes magnetic core 21*a* through which power lines 110*a*, 120*a* extend, and detects combined currents flowing through power lines 110*a*, 120*a* according to the magnetic field produced at magnetic core 21*a*. Specifically, electric current detector 20*a* includes magnetic core 21*a* through which power line 120*a* and branch path 111*d* included in power line 110*a* and connecting branch point N and one input/output terminal of DC/DC converter 42 extend, and detects combined currents flowing in branch path 111*d* and power line 120*a* according to the magnetic field produced at magnetic core 21*a*. For example, power line 110*a* connected to one input/output terminal of DC/DC converter 42 and power line 120*a* connected to the other input/output terminal of DC/DC converter 42 are bound together at magnetic core 21*a* and extend through magnetic core 21*a*, as illustrated in FIG. 1. For example, the two or more power lines include a power line through which, at the magnetic core, the direct current flows in the direction opposite to the direction of the direct currents flowing through the other power lines. In this example, power lines 110*a*, 120*a* extend through magnetic core 21*a* in such a manner that the direction of the direct current flowing through power line 110*a* and the direction of the direct current flowing through power line 120*a* are opposite to each other at magnetic core 21*a*.

Magnetic core 21*a* is in the form of a loop (in this example, the form of a circular ring) through which the power lines can extend; electric currents flowing through the power lines extending through the hole of magnetic core 21*a* produce, at the core, a magnetic field that corresponds to said electric currents. Note that magnetic core 21*a* is not limited to being in the form of a circular ring and may be in the form of a rectangular loop or the like.

Furthermore, electric current detector 20*a* includes, for example, a Hall element (not illustrated in the drawings) that detects the magnetic field produced at magnetic core 21*a* and generates a voltage corresponding to the magnetic field produced at magnetic core 21*a*. The voltage generated by the Hall element is input to arc determiner 30*a* as a signal indicating the magnetic field produced at magnetic core 21*a*, that is, the electric currents flowing through power lines 110*a*, 120*a* extending through the magnetic core 21*a*.

Arc determiner 30*a* is, for example, a microcomputer. The microcomputer is a semiconductor integrated circuit or the like including read-only memory (ROM) and random-access memory (RAM) each having a program stored therein, a processor (a central processing unit) (CPU) that executes the program, a timer, an A/D converter, a D/A converter, and the like. Note that arc determiner 30*a* may be provided as hardware using a dedicated electronic circuit including an A/D converter, a logical circuit, a gate array, a D/A converter, and the like, or an amplifier and a filter circuit, for example.

Arc determiner 30*a* determines, on the basis of the combined currents detected by electric current detector 20*a*, whether an electric arc has occurred. For example, arc determiner 30*a* determines, by performing a frequency analysis on the combined currents detected by electric current detector 20*a*, whether an electric arc has occurred in power line 110*a* or 120*a*. An electric current resulting from the occurrence of an electric arc includes frequency components attributed to the electric arc; thus, by detecting said frequency components, it is possible to determine whether an electric arc has occurred. When arc determiner 30*a* determines that an electric arc has occurred, it is clear that the electric arc has occurred in one of power lines 110*a*, 120*a*. This means that electric arcs in the two or more power lines (in this example, power lines 110*a*, 120*a*) can be detected using only one electric current detector 20*a* (specifically, magnetic core 21*a*).

Note that the two or more power lines extending through magnetic core 21*a* may include a power line other than power line 110*a* (specifically, branch path 111*d*) and power line 120*a*. For example, the two or more power lines may further include at least one of power line 130*a* or 130*b* and power line 140*a* or 140*b*. In other words, at least one of power line 130*a* or 130*b* and power line 140*a* or 140*b* may also extend through magnetic core 21*a*.

As described above, arc detection device 10*a* according to the present embodiment is used in system 1*a* including one or more power sources (for example, a power source selected from solar cell 62, system power supply 48, and storage batteries 51, 52), a plurality of converters (for example, a plurality of converters selected from DC/DC converters 41, 42, 43, and inverter 44) that adjust the voltages of the one or more power sources, and a plurality of load devices (for example, a plurality of load devices selected from storage batteries 51, 52, system power supply 48, and inverter 44). A plurality of power lines (for example, power lines 110*a*, 110*b*, 120*a*, 120*b*, 130*a*, 130*b*, 140*a*, 140b, 150a, 150b) are used for the connection between the one or more power sources and the plurality of converters and the connection between the plurality of converters and the plurality of load devices. Arc detection device 10a includes: electric current detector 20a which includes magnetic core 21a through which two or more power lines (for example, power lines 110a, 120a) included in the plurality of power lines extend, and detects combined currents flowing through the two or more power lines according to the magnetic field produced at magnetic core 21a; and arc determiner 30a which determines, on the basis of the combined currents detected by electric current detector 20a, whether an electric arc has occurred. One or more converters included in the plurality of converters are connected to one or more power sources, and one or more converters included in the plurality of converters are connected to each of the plurality of load devices.

With this, the two or more power lines (for example, power lines 110a, 120a) are bound together and extend through one magnetic core 21a; thus, no matter in which power line included in the two or more power lines an electric arc occurs, the electric arc can be detected. This means that even when the arc detection means is not provided in each of the two or more power lines, electric arcs occurring in the two or more power lines can be detected. In other words, there is no need to increase the size and cost of the system, and electric arcs occurring in the plurality of (two or more) power lines can be easily detected using one electric current detector 20a. For example, when an electric arc is detected, DC/DC converters 41, 42, 43 and inverter 44 can be stopped or a circuit breaker (not illustrated in the drawings) or the like provided in each power line can be operated to shut off an electric current flowing through the power line, for example, on the basis of the result of the detection.

For example, the two or more power lines may be power line 110a connected to one input/output terminal of the first converter (for example, DC/DC converter 42) included in the plurality of converters and power line 120a connected to the other input/output terminal of the first converter (for example, DC/DC converter 42) included in the plurality of converters.

With this, it is possible to detect an electric arc occurring in power line 110a connected to one input/output terminal of the first converter and power line 120a connected to the other input/output terminal of the first converter.

For example, the two or more power lines may include power lines through which electric currents flow in the opposite directions at magnetic core 21a.

For example, in the two or more power lines, high direct currents flow and thus, magnetic saturation may occur at magnetic core 21a. Therefore, when electric arcs occur in the two or more power lines, there is a risk that an arc-induced electric current (alternating current) superimposed on the direct currents flowing in the two or more power lines cannot be accurately detected due to the magnetic saturation caused by the direct currents. In this regard, the two or more power lines are provided extending through magnetic core 21a so as to include a power line through which at magnetic core 21a, the direct current flows in the direction opposite to the direction of the direct currents flowing through the other power lines, and thus the magnetic fields produced by the direct currents flowing through the power lines through which the direct currents flow in the opposite directions can be canceled out, preventing the magnetic saturation. Therefore, electric arcs occurring in the two or more power lines can be accurately detected. Note that when the direct current flowing through the power line (specifically, branch path 111d in power line 110a) connected to one input/output terminal of the first converter is less than the direct current flowing through power line 120a connected to the other input/output terminal of the first converter (for example, when DC/DC converter 42 is a step-down converter), power line 110a connected to one input/output terminal of the first converter may be wound around magnetic core 21a at least once, and power line 110a may be led through magnetic core 21a at least twice. This makes it easier to evenly cancel out the magnetic field produced by the direct current flowing through power line 110a connected to one input/output terminal of the first converter and the magnetic field produced by the direct current flowing through power line 120a connected to the other input/output terminal of the first converter.

A solar power generation system (for example, system 1a) according to the present embodiment includes arc detection device 10a. At least one power source included in the one or more power source is solar cell 62. Another power source included in the one or more power sources is system power supply 48. One load device included in the plurality of load devices is a DC/AC converter (for example, inverter 44) connected to system power supply 48.

Thus, it is possible to provide a solar power generation system capable of easily detecting electric arcs occurring in the plurality of (two or more) power lines.

A storage battery system (for example, system 1a) according to the present embodiment includes: arc detection device 10a; storage batteries 51, 52 each of which operates as at least one power source included in the one or more power sources or at least one load device included in the plurality of load devices; and system power supply 48 which operates as at least one power source included in the one or more power sources or at least one load device included in the plurality of load devices. During charging of storage batteries 51, 52, system power supply 48 operates as a power source, the converter (for example, inverter 44) connected to system power supply 48 operates as an AC/DC converter, and storage batteries 51, 52 and the converters (for example, DC/DC converters 42, 43) connected to storage batteries 51, 52 each operate as a load device. During discharging of storage batteries 51, 52, storage batteries 51, 52 each operate as a power source, the converters connected to storage batteries 51, 52 operate as DC/DC converters 42, 43, and system power supply 48 and the converter (for example, inverter 44) connected to system power supply 48 each operate as a load device.

Thus, it is possible to provide a storage battery system capable of easily detecting electric arcs occurring in the plurality of (two or more) power lines.

For example, at least one power source included in the one or more power sources may be solar cell 62.

Thus, it is possible to provide a system including a photovoltaic function and a power storage function and capable of easily detecting electric arcs occurring in the plurality of (two or more) power lines.

Variation of Embodiment 1

Embodiment 1 has thus far described an example in which arc detection device 10a includes one electric current detector 20a. Variation of Embodiment 1 will describe an example in which the arc detection device includes a plurality of (for example, two) electric current detectors.

Figure 2:
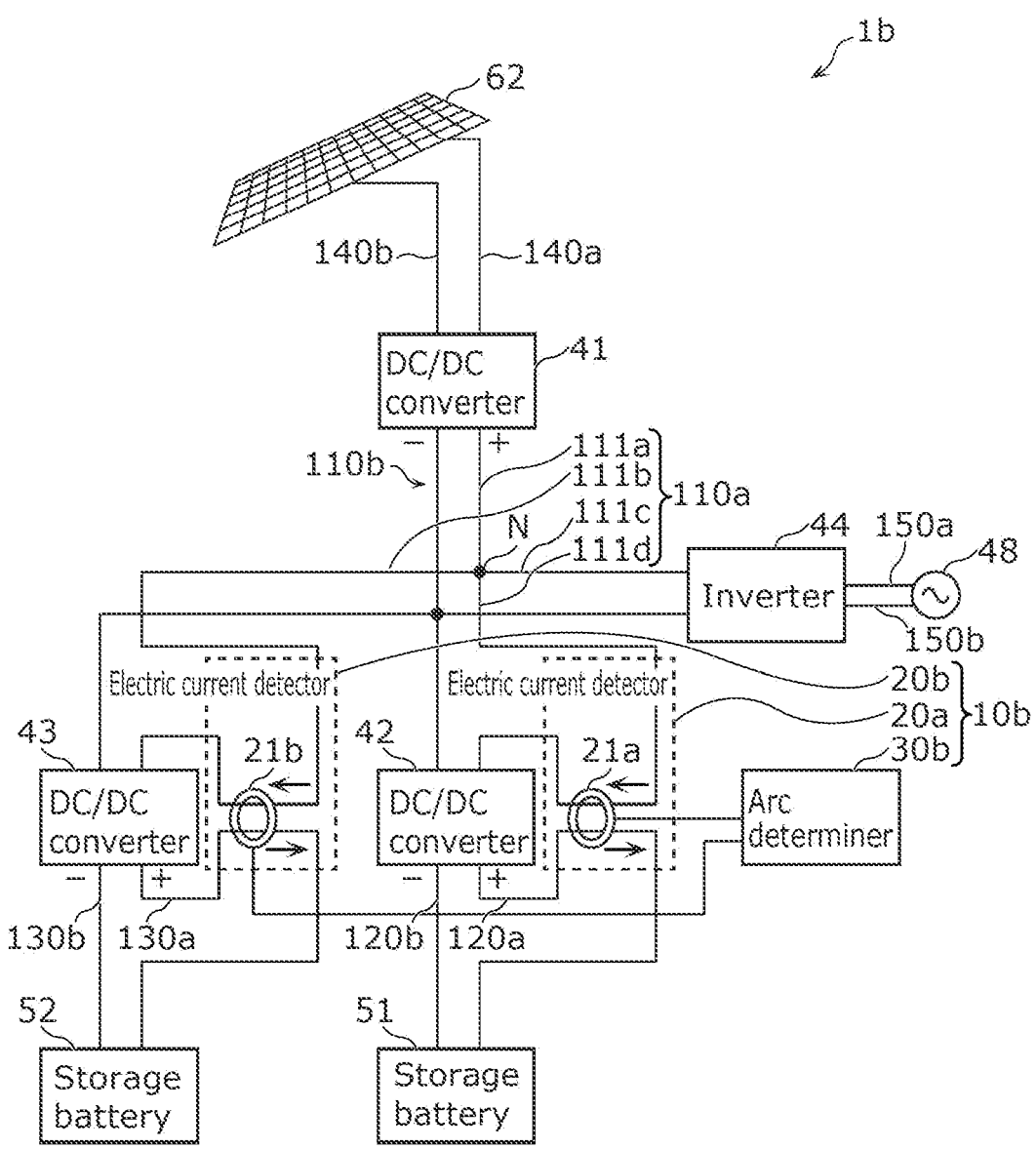
FIG. 2 is a configuration diagram illustrating one example of a system according to a variation of Embodiment 1.

FIG. 2 is a configuration diagram illustrating one example of system 1b according to a variation of Embodiment 1.

System 1b is different from system 1a according to Embodiment 1 in that arc detection device 10b is included instead of arc detection device 10a. The other features are the same as those in Embodiment 1 and as such, description thereof will be omitted.

Arc detection device 10b includes electric current detectors 20a, 20b and arc determiner 30b.

Electric current detector 20a is the same as that described in Embodiment 1 and as such, description thereof will be omitted. Note that in the variation of Embodiment 1, signals indicating electric currents flowing through power lines 110a, 120a extending through magnetic core 21a in electric current detector 20a are input to arc determiner 30b.

Electric current detector 20b includes magnetic core 21b through which power lines 110a, 130a extend, and detects electric currents flowing through power lines 110a, 130a according to the magnetic field produced at magnetic core 21b. Specifically, electric current detector 20b includes magnetic core 21b through which branch path 111b in power line 110a connecting branch point N and DC/DC converter 43 and power line 130a connected to the other input/output terminal of DC/DC converter 43 extend, and detects electric currents flowing in branch path 111b and power line 130a according to the magnetic field produced at magnetic core 21b. For example, power line 110a connected to one input/output terminal of DC/DC converter 43 and power line 130a connected to the other input/output terminal of DC/DC converter 43 are bound together at magnetic core 21b and extend through magnetic core 21b, as illustrated in FIG. 2. For example, power lines 110a, 130a include a power line through which, at magnetic core 21b, the direct current flows in the direction opposite to the direction of the direct currents flowing through the other power lines. In this example, power lines 110a, 130a extend through magnetic core 21b in such a manner that the direction of the direct current flowing through power line 110a and the direction of the direct current flowing through power line 130a are opposite to each other at magnetic core 21b.

Magnetic core 21b is in the form of a loop (in this example, the form of a circular ring) through which the power lines can extend; electric currents flowing through the power lines extending through the hole of magnetic core 21b produce, at the core, a magnetic field that corresponds to said electric currents. Note that magnetic core 21b is not limited to being in the form of a circular ring and may be in the form of a rectangular loop or the like.

Furthermore, electric current detector 20b includes, for example, a Hall element (not illustrated in the drawings) that detects the magnetic field produced at magnetic core 21b and generates a voltage corresponding to the magnetic field produced at magnetic core 21b. The voltage generated by the Hall element is input to arc determiner 30b as a signal indicating the magnetic field produced at magnetic core 21b, that is, the electric currents flowing through power lines 110a, 130a extending through the magnetic core 21b.

Similar to arc determiner 30a, arc determiner 30b is a microcomputer, but may be provided as hardware using a dedicated electronic circuit or an amplifier and a filter circuit, for example.

Arc determiner 30b locates, on the basis of the electric currents detected by electric current detectors 20a, 20b, electric arcs that have occurred. For example, arc determiner 30b determines, by performing a frequency analysis on the electric current detected by electric current detector 20a, whether an electric arc has occurred in power line 110a or 120a, and determines, by performing a frequency analysis on the electric current detected by electric current detector 20b, whether an electric arc has occurred in power line 110a or 130a.

When arc determiner 30b determines, from the electric current detected by electric current detector 20a, that an electric arc has occurred in power line 110a or 120a and determines, from the electric current detected by electric current detector 20b, that an electric arc has occurred in power line 110a or 130a, arc determiner 30b can determine that the electric arc has occurred in power line 110a. This is because when an electric arc occurs in power line 110a, electric currents generated by the occurrence of the electric arc flow in both branch paths 111d, 111b connected at branch point N, and both electric current detectors 20a, 20b detect said electric currents.

When arc determiner 30b determines, from the electric current detected by electric current detector 20a, that an electric arc has occurred in power line 110a or 120a and determines, from the electric current detected by electric current detector 20b, that no electric arc has occurred in power line 110a or 130a, arc determiner 30b can determine that the electric arc has occurred in power line 120a. This is because when an electric arc occurs in power line 120a, the electric current generated by the occurrence of the electric arc flows through power line 120a and electric current detector 20a detects said electric current, while the electric current generated by the occurrence of the electric arc does not flow through power lines 110a, 130a and electric current detector 20b does not detect said electric current.

When arc determiner 30b determines, from the electric current detected by electric current detector 20a, that no electric arc has occurred in power line 110a or 120a and determines, from the electric current detected by electric current detector 20b, that an electric arc has occurred in power line 110a or 130a, arc determiner 30b can determine that the electric arc has occurred in power line 130a. This is because when an electric arc occurs in power line 130a, the electric current generated by the occurrence of the electric arc flows through power line 130a and electric current detector 20b detects said electric current, while the electric current generated by the occurrence of the electric arc does not flow through power lines 110a, 120a and electric current detector 20a does not detect said electric current.

Note that the two or more power lines extending through magnetic core 21b may include a power line other than power line 110a (specifically, branch path 111b) and power line 130a. For example, the two or more power lines may further include power line 140a or 140b. In other words, power line 140a or 140b may also extend through magnetic core 21b.

Thus, arc detection device 10b includes a plurality of electric current detectors, and arc determiner 30b locates, on the basis of the electric current detected by the plurality of electric current detectors (for example, electric current detectors 20a, 20b), an electric arc that has occurred.

With this, when the plurality of electric current detectors detect the electric current generated by the occurrence of an electric arc, it can be determined that the electric arc has occurred in a branch power line (that is, power line 110a) subject to electric arc detection of all the electric current detectors, and when only one of the plurality of electric current detectors detects the electric current generated by the occurrence of an electric arc, it can be determined that the electric arc has occurred in a power line (for example, power line 120a, 130a, or the like) subject to electric arc detection of said electric current detector alone.

Embodiment 2

Embodiment 1 and the variation thereof have thus far described examples where the arc detection device is provided in a system such as the solar power generation system or the storage battery system, but the arc detection device may be provided in an indoor power line system. This will be described with reference to FIG. 3.

Figure 3:
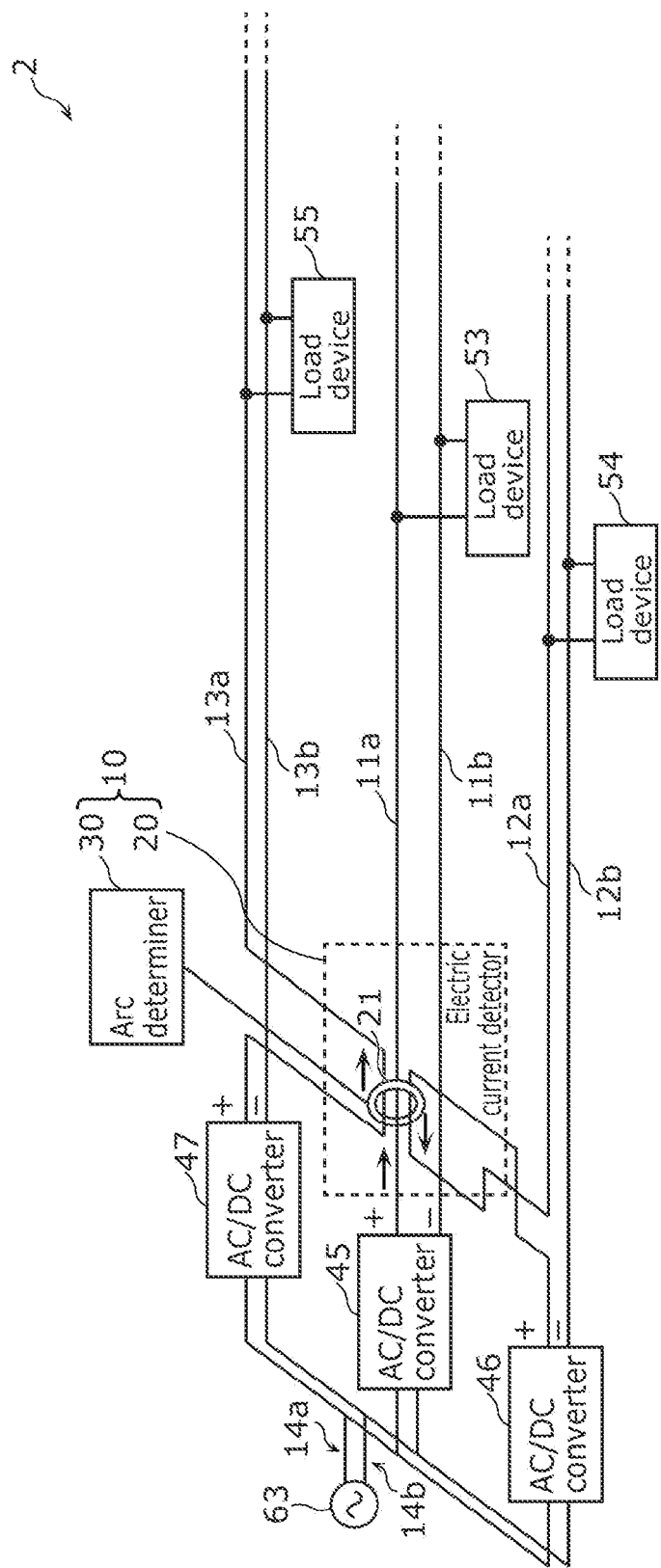
FIG. 3 is a configuration diagram illustrating one example of an indoor power line system according to Embodiment 2.

FIG. 3 is a configuration diagram illustrating one example of indoor power line system 2 according to Embodiment 2.

Indoor power line system 2 includes one or more power sources, a plurality of converters that adjust the voltages of the one or more power sources, and a plurality of load devices. Furthermore, indoor power line system 2 includes arc detection device 10. In Embodiment 2, system power supply 63 is illustrated as the one or more power sources. Furthermore, AC/DC converters 45, 46, 47 are illustrated as the plurality of converters. Furthermore, load devices 53, 54, 55 are illustrated as the plurality of load devices.

One or more converters included in the plurality of converters are connected to the one or more power sources, and one or more converters included in the plurality of converters are connected to each of the plurality of load devices. In Embodiment 2, AC/DC converters 45, 46, 47 are connected to system power supply 63, AC/DC converter 45 is connected to load device 53, AC/DC converter 46 is connected to load device 54, and AC/DC converter 47 is connected to load device 55.

The one or more power sources and the plurality of converters are connected by a plurality of power lines, and the plurality of converters and the plurality of load devices are connected by a plurality of power lines. In Embodiment 2, system power supply 63 and AC/DC converters 45, 46, 47 are connected by the plurality of power lines, AC/DC converter 45 and load device 53 are connected by the plurality of power lines, AC/DC converter 46 and load device 54 are connected by the plurality of power lines, and AC/DC converter 47 and load device 55 are connected by the plurality of power lines. Specifically, system power supply 63 and AC/DC converters 45, 46, 47 are connected by power lines 14a, 14b, AC/DC converter 45 and load device 53 are connected by power lines 11a, 11b, AC/DC converter 46 and load device 54 are connected by power lines 12a, 12b, and AC/DC converter 47 and load device 55 are connected by power lines 13a, 13b.

AC/DC converters 45, 46, 47, power lines 11a, 11b, 12a, 12b, 13a, 13b, 14a, 14b, load devices 53, 54, 55, and arc detection device 10 are installed inside a facility such as a detached house, an apartment, a building, or a factory.

System power supply 63 supplies alternating-current power generated at a power station or the like. Alternating currents flow through power lines 14a, 14b connecting system power supply 63 and AC/DC converters 45, 46, 47.

AC/DC converters 45, 46, 47 receive the alternating-current power from system power supply 63, convert the received alternating-current power into direct-current power, and output the direct-current power.

AC/DC converter 45 converts, into direct-current power, the alternating-current power received from system power supply 63, and outputs the direct-current power to load device 53. AC/DC converter 45 includes a positive electrode and a negative electrode; power line 11a is connected to the positive electrode, and power line 11b is connected to the negative electrode. Load device 53 receives the direct-current power from AC/DC converter 45.

AC/DC converter 46 converts, into direct-current power, the alternating-current power received from system power supply 63, and outputs the direct-current power to load device 54. AC/DC converter 46 includes a positive electrode and a negative electrode; power line 12a is connected to the positive electrode, and power line 12b is connected to the negative electrode. Load device 54 receives the direct-current power from AC/DC converter 46.

AC/DC converter 47 converts, into direct-current power, the alternating-current power received from system power supply 63, and outputs the direct-current power to load device 55. AC/DC converter 47 includes a positive electrode and a negative electrode; power line 13a is connected to the positive electrode, and power line 13b is connected to the negative electrode. Load device 55 receives the direct-current power from AC/DC converter 47.

A direct current flows through each of power lines 11a, 11b, 12a, 12b, 13a, 13b. Power lines 11a, 12a, 13a are one example of two or more power lines extending through magnetic core 21 to be described later.

Load devices 53, 54, 55 are not particularly limited as long as these devices are provided indoors and driven by direct currents. For example, load devices 53, 54, 55 may be light fixtures, fans, loudspeakers, microphones, or the like.

For example, there is a possibility that an electric arc may occur in any of power lines 11a, 12a, 13a through which the direct currents flow. If the arc detection means is provided in all power lines 11a, 12a, 13a, an electric arc that has occurred in power line 11a, an electric arc that has occurred in power line 12a, and an electric arc that has occurred in power line 13a can be detected, but the size and cost of the system (for example, indoor power line system 2) would increase.

Thus, arc detection device 10 is used in order to easily detect electric arcs occurring in two or more power lines (in this example, for example, power lines 11a, 12a, 13a) included in the plurality of power lines in indoor power line system 2.

Arc detection device 10 includes electric current detector 20 and arc determiner 30.

Electric current detector 20 includes magnetic core 21 through which power lines 11a, 12a, 13a extend, and detects combined currents flowing through power lines 11a, 12a, 13a according to the magnetic field produced at magnetic core 21. For example, power lines 11a, 12a, 13a connected to the output terminals of AC/DC converters 45, 46, 47 are bound together at magnetic core 21 and extend through magnetic core 21, as illustrated in FIG. 3. For example, the two or more power lines include a power line through which, at the magnetic core, the direct current flows in the direction opposite to the direction of the direct currents flowing through the other power lines. In this example, power lines 11a, 12a, 13a extend through magnetic core 21 in such a manner that the direction of the direct current flowing through power line 12a and the direction of the direct currents flowing through power lines 11a, 13a are opposite to each other at magnetic core 21. For example, power line 12a through which, at magnetic core 21, the direct current flows in the direction opposite to the directions of the direct currents flowing through other power lines 11a, 13a is a power line through which the largest direct current is expected to flow among power lines 11a, 12a, 13a. Since the direction of the direct current flowing through power line 12a through which the largest direct current is expected to flow among power lines 11a, 12a, 13a is opposite to the direction of the direct currents flowing through other power lines 11a, 13a, the magnetic field produced by the direct current flowing through power line 12a is easily canceled out by the magnetic field produced by the direct current flowing through power line 11a and the magnetic field produced by the direct current flowing through power line 13a, making it easy to prevent the magnetic saturation.

Magnetic core 21 is in the form of a loop (in this example, the form of a circular ring) through which the power lines can extend; electric currents flowing through the power lines extending through the hole of magnetic core 21 produce, at the core, a magnetic field that corresponds to said electric currents. Note that magnetic core 21 is not limited to being in the form of a circular ring and may be in the form of a rectangular loop or the like.

Furthermore, electric current detector 20 includes, for example, a Hall element (not illustrated in the drawings) that detects the magnetic field produced at magnetic core 21 and generates a voltage corresponding to the magnetic field produced at magnetic core 21. The voltage generated by the Hall element is input to arc determiner 30 as a signal indicating the magnetic field produced at magnetic core 21, that is, the electric currents flowing through power lines 11a, 12a, 13a extending through the magnetic core 21.

Similar to arc determiner 30a, arc determiner 30 is a microcomputer, but may be provided as hardware using a dedicated electronic circuit or an amplifier and a filter circuit, for example.

Arc determiner 30 determines, on the basis of the combined currents detected by electric current detector 20, whether an electric arc has occurred. For example, arc determiner 30 determines, by performing a frequency analysis on the combined currents detected by electric current detector 20, whether an electric arc has occurred in power line 11a, 12a, or 13a. An electric current resulting from the occurrence of an electric arc includes frequency components attributed to the electric arc; thus, by detecting said frequency components, it is possible to determine whether the electric arc has occurred. When arc determiner 30 determines that an electric arc has occurred, it is clear that the electric arc has occurred in one of power lines 11a, 12a, and 13a. This means that electric arcs in the two or more power lines (in this example, power lines 11a, 12a, 13a) can be detected using only one electric current detector 20 (specifically, magnetic core 21).

Note that the number of power lines extending through magnetic core 21 is not limited to three, may be two, or may be four or more.

As described above, indoor power line system 2 according to the present embodiment includes arc detection device 10; one power source included in the one or more power sources includes system power supply 63, and the plurality of converters include AC/DC converters 45, 46, 47.

Thus, arc detection device 10 may be applied to indoor power line system 2; it is possible to provide indoor power line system 2 capable of easily detecting electric arcs occurring in the plurality of (two or more) power lines.

Other Embodiments

The arc detection device, etc., according to the embodiments have been described thus far, but the present invention is not limited to the embodiments described above.

For example, Embodiment 1 and the variation thereof have thus far described examples where systems 1a, 1b each include single solar cell 62, but systems 1a, 1b may each include two or more solar cells.

For example, Embodiment 1 and the variation thereof have thus far described examples where systems 1a, 1b each include two storage batteries 51, 52, but systems 1a, 1b may each include three or more storage batteries.

For example, Embodiment 1 and the variation thereof have thus far described examples where systems 1a, 1b each include three DC/DC converters 41, 42, 43, but systems 1a, 1b may each include four or more DC/DC converters.

For example, Embodiment 1 and the variation thereof have thus far described examples where systems 1a, 1b each include solar cell 62, but systems 1a, 1b do not need to include solar cell 62. In other words, systems 1a, 1b may each be a storage battery system that does not include the photovoltaic function.

For example, Embodiment 1 and the variation thereof have thus far described examples where systems 1a, 1b each include storage batteries 51, 52, but systems 1a, 1b do not need to include storage batteries 51, 52. In other words, systems 1a, 1b may each be a solar power generation system that does not include the power storage function.

For example, the variation of Embodiment 1 has thus far described an example where system 1b includes two electric current detectors 20a, 20b, but system 1b may include three or more electric current detectors, for example, according to the number of DC/DC converters provided therein.

For example, Embodiment 2 has thus far described an example where indoor power line system 2 includes three AC/DC converters 45, 46, 47, but indoor power line system 2 may include two AC/DC converters or may include four or more AC/DC converters.

For example, Embodiment 2 has thus far described an example where indoor power line system 2 includes three load devices 53, 54, 55, but indoor power line system 2 may include two load devices or may include four or more load devices.

For example, the embodiments have thus far described examples where the two or more power lines include a power line through which, at the magnetic core, the direct current flows in the direction opposite to the direction of the direct currents flowing through the other power lines, all the direct currents may flow through the two or more power lines in the same direction at the magnetic core.

For example, the arc determiner included in the arc detection device may be provided as software for a general-purpose computer such as a personal computer.

Forms obtained by various modifications to the embodiments that can be conceived by a person having ordinary skill in the art, and forms configured by arbitrarily combining structural elements and functions in different embodiments which are within the scope of the essence of the present invention are included in the present invention.

The invention claimed is:

1. An arc detection device in a system including one or more power sources, a plurality of converters that adjust voltages of the one or more power sources, and a plurality of load devices, the one or more power sources and the plurality of converters being connected to each other by a first plurality of power lines, the plurality of converters and the plurality of load devices being connected to each other by a second plurality of power lines, the arc detection device comprising:

an electric current detector that includes a magnetic core through which two or more power lines extend, the two or more lines correspond to (a) at least one power line included in the first plurality of power lines and at least one power line included in the second plurality of power lines or (b) power lines included in the second plurality of power lines through which electric currents flow in opposite directions at the magnetic core, and detects combined currents flowing through the two or more power lines according to a magnetic field produced at the magnetic core; and an arc determiner that determines, based on the combined currents detected by the electric current detector, whether an electric arc has occurred, wherein one or more converters included in the first plurality of converters are connected to the one or more power sources, and one or more converters included in the second plurality of converters are connected to each of the plurality of load devices.

2. The arc detection device according to claim 1, wherein the two or more power lines are a power line connected to one input terminal of a first converter included in the plurality of converters and a power line connected to an output terminal of the first converter.

3. The arc detection device according to claim 2, comprising:

a plurality of the electric current detectors, wherein the arc determiner locates, based on electric currents detected by the plurality of electric current detectors, the electric arc that has occurred.

4. An indoor power line system comprising:

the arc detection device according to claim 1, wherein one power source included in the one or more power sources includes a system power supply, and the plurality of converters include AC/DC converters.

5. A solar power generation system comprising:

the arc detection device according to claim 1, wherein at least one power source included in the one or more power sources includes a solar cell, another power source included in the one or more power sources includes a system power supply, and one load device included in the plurality of load devices includes a DC/AC converter connected to the system power supply.

6. A storage battery system comprising:

the arc detection device according to claim 1;

a storage battery that operates as at least one power source included in the one or more power sources or at least one load device included in the plurality of load devices; and a system power supply that operates as at least one power source included in the one or more power sources or at least one load device included in the plurality of load devices, wherein during charging of the storage battery, the system power supply operates as a power source, a converter connected to the system power supply operates as an AC/DC converter, and the storage battery and a converter connected to the storage battery each operate as a load device, and during discharging of the storage battery, the storage battery operates as a power source, a converter connected to the storage battery operates as a DC/DC converter, and the system power supply and a converter connected to the system power supply each operate as a load device.

7. The storage battery system according to claim 6, wherein at least one power source included in the one or more power sources includes a solar cell.

8. The arc detection device according to claim 1, wherein the two or more power lines are a power line connected to an output terminal of a first converter included in the plurality of converters and a power line connected to an output terminal of a second converter included in the plurality of converters.

9. The arc detection device according to claim 8, comprising:

a plurality of the electric current detectors, wherein the arc determiner locates, based on electric currents detected by the plurality of electric current detectors, the electric arc that has occurred.

* * * * *